(12) United States Patent
Yen et al.

(10) Patent No.: US 11,322,428 B2
(45) Date of Patent: May 3, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: You-Lung Yen, Kaohsiung (TW); Bernd Karl Appelt, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 9 days.

(21) Appl. No.: 16/700,761

(22) Filed: Dec. 2, 2019

(65) Prior Publication Data
US 2021/0166993 A1 Jun. 3, 2021

(51) Int. Cl.
| | | |
|---|---|---|
| H01L 23/48 | (2006.01) | |
| H01L 23/482 | (2006.01) | |
| H01L 23/31 | (2006.01) | |
| H01L 21/762 | (2006.01) | |
| H01L 23/00 | (2006.01) | |
| H01L 21/56 | (2006.01) | |

(52) U.S. Cl.
CPC .......... *H01L 23/481* (2013.01); *H01L 21/563* (2013.01); *H01L 21/76224* (2013.01); *H01L 23/3157* (2013.01); *H01L 23/4825* (2013.01); *H01L 24/05* (2013.01); *H01L 2224/02371* (2013.01)

(58) Field of Classification Search
None
See application file for complete search history.

(56) References Cited

U.S. PATENT DOCUMENTS

| | | | | |
|---|---|---|---|---|
| 2005/0045369 A1* | 3/2005 | Ishimaru | ............. | H01L 23/4334 174/250 |
| 2008/0157336 A1* | 7/2008 | Yang | ....................... | H01L 24/82 257/690 |
| 2008/0191297 A1* | 8/2008 | Yang | ................. | H01L 27/14632 257/432 |
| 2008/0246135 A1* | 10/2008 | Wong | ..................... | H05K 1/185 257/686 |
| 2013/0337648 A1* | 12/2013 | Lin | ......................... | H01L 23/13 438/675 |
| 2015/0279814 A1* | 10/2015 | Hurwitz | .................. | H01L 24/97 257/774 |
| 2017/0271266 A1* | 9/2017 | Kim | ..................... | H01L 23/5383 |
| 2018/0076103 A1* | 3/2018 | Jeon | ....................... | H01L 23/045 |
| 2021/0167016 A1* | 6/2021 | Lu | ....................... | H01L 21/76877 |

* cited by examiner

*Primary Examiner* — Long Pham
(74) *Attorney, Agent, or Firm* — Foley & Lardner LLP

(57) ABSTRACT

A semiconductor device package includes a substrate, a first semiconductor die, a conductive via, a first contact pad and a second contact pad. The substrate includes a first surface, and a second surface opposite to the first surface, the substrate defines a cavity through the substrate. The first semiconductor die is disposed in the cavity, wherein the first semiconductor die includes an active surface adjacent to the first surface, and an inactive surface. The conductive via penetrates through the substrate. The first contact pad is exposed from the active surface of the first semiconductor die and adjacent to the first surface of the substrate. The second contact pad is disposed on the first surface of the substrate, wherein the second contact pad is connected to a first end of the conductive via.

12 Claims, 24 Drawing Sheets

SEMICONDUCTOR DEVICE PACKAGE AND METHOD OF MANUFACTURING THE SAME

BACKGROUND

1. Technical Field

The present disclosure relates generally to a semiconductor device package. More particularly, the present disclosure relates to a semiconductor device package integrating all functional chips into a three-dimensional integrated fan-out structure, which is referred to as a pseudo-system on chip (SoC) or system in package.

2. Description of the Related Art

Fan-out wafer-level package (FOWLP) is an emerging packaging technique. Its main feature is that it can achieve a wider redistribution layer (RDL) under the same chip size. By doing so, the number of pins can also increase. Future wafers produced with such technique can thus support much more powerful functional outputs, and can integrate much more functional applications into a single wafer. The advantages of such technique also include packaging without load board, package thinning, and lower manufacturing costs.

SUMMARY

In some embodiments, a semiconductor device package includes a substrate, a first semiconductor die, a conductive via, a first contact pad and a second contact pad. The substrate includes a first surface, and a second surface opposite to the first surface, the substrate defines a cavity through the substrate. The first semiconductor die is disposed in the cavity, wherein the first semiconductor die includes an active surface adjacent to the first surface, and an inactive surface. The conductive via penetrates through the substrate. The first contact pad is exposed from the active surface of the first semiconductor die and adjacent to the first surface of the substrate. The second contact pad is disposed on the first surface of the substrate, wherein the second contact pad is connected to a first end of the conductive via.

In some embodiments, a semiconductor device package includes a substrate, a semiconductor die and a conductive via. The substrate includes a first surface, and a second surface opposite to the first surface. The substrate defines a cavity through the substrate. The semiconductor die is disposed in the cavity. The conductive via penetrates through the substrate, wherein the conductive via includes an insulating structure and a conductive structure. The insulating structure penetrates through the substrate. The conductive structure is between an edge of the substrate and a sidewall of the insulating structure.

In some embodiments, a method of manufacturing a semiconductor device package includes the following steps: providing a substrate; forming a through hole and a cavity through the substrate; forming a conductive via; and disposing a semiconductor die into the cavity. Forming a conductive via includes the steps of: forming a liner conductive structure on edges of the through hole; and filling an insulative structure in the through hole.

Figure 1A:
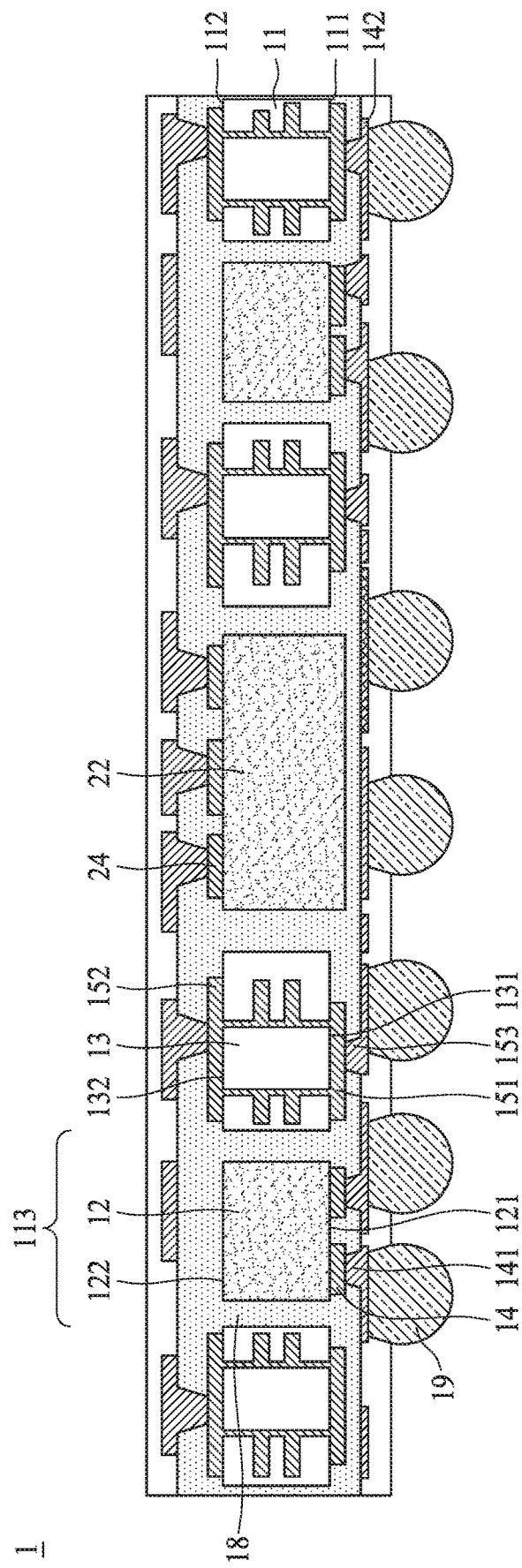
FIG. 1A illustrates a cross-sectional view of a semiconductor device package in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

During wafer-level packaging, several issues emerge. Regarding the fan-in wafer-level chip-scale package (WLCSP) technique, the pin number of the fan-in WLCSP is constrained by the size of the die. Therefore, fan-in WLCSP can just provide a single functional output. In comparison with the fan-in WLCSP, the fan-out WLCSP can provide multiple functional outputs. However, it would be difficult to build an RDL on the fan-out WLCSP. Regarding the package-on-package (PoP) technique, it would specify using complex structures such as tall pillars, through mold vias (TMVs) or cavity substrates for implementing. Although the chip-on-wafer-on-substrate (CoWoS) technique can integrate dies with different functions into one package structure, it would be difficult to stack dies in the CoWoS package. As for three-dimensional (3D) IC technique, although a 3D IC can use through silicon vias (TSVs) to stack dies of different functions, the high cost of the TSVs makes the 3D IC technique become less attractive for ordinary electronic devices.

The present disclosure relates to a 3D integrated fan-out panel-level package structure and fan out wafer-level package structure. In some embodiments, pluralities of cavities and via holes are formed in a substrate by laser drilling. Dies are then placed into the cavities, and the pads are connected by directly electroplating. Dielectric material are filled into the via holes to form a via structure with high aspect ratio. That is, the present disclosure relates to using a substrate with cavities to replace the tall pillars, TSVs and TMVs for integrating dies with different functions so as to achieve a high product yield.

FIG. 1A illustrates a cross-sectional view of a semiconductor device package 1 in accordance with some embodiments of the present disclosure. In some embodiments, a semiconductor device package 1 includes a substrate 11, a semiconductor die 12, a conductive via 13, a contact pad 14 and a contact pad 151. The substrate 11 includes a surface 111, and a surface 112 opposite to the surface 111, the substrate 11 defines a cavity 113 through the substrate 11. The semiconductor die 12 is disposed in the cavity 113, wherein the semiconductor die 12 includes an active surface 121 adjacent to the first surface 111, and an inactive surface 122. The conductive via 13 penetrates through the substrate 11. The contact pad 14 is exposed from the active surface 121 of the semiconductor die 12 and adjacent to the surface 111 of the substrate 11. The contact pad 151 is disposed on, adjacent to, or embedded in and exposed by the surface 111 of the substrate 11, wherein the contact pad 151 is connected to an end 131 of the conductive via 13.

In some embodiments, the contact pad 14 and the contact pad 151 are substantially leveled. In some embodiments, a surface of the contact pad 14 and a surface of the contact pad 151 are substantially coplanar. In some embodiments, an encapsulation layer 18 is disposed in the cavity 113 and encapsulating edges of the semiconductor die 12. In some embodiments, the encapsulation layer 18 further encapsulates the active surface 121 of the first semiconductor die 12. In some embodiments, the encapsulation layer 18 further encapsulates edges of the contact pad 14 and edges of the contact pad 151. In some embodiments, the encapsulation layer 18 further encapsulates the inactive surface 122 of the semiconductor die 12. In some embodiments, a contact pad 152 disposed on, adjacent to, or embedded in and exposed by the surface 112 of the substrate 11, wherein the contact pad 152 is connected to an end 132 of the conductive via 13. In some embodiments, the encapsulation layer 18 further encapsulates the third contact pad 152. In some embodiments, the inactive surface 122 of the semiconductor die 12 and the surface 112 of the substrate 11 are substantially leveled.

Figure 1B:
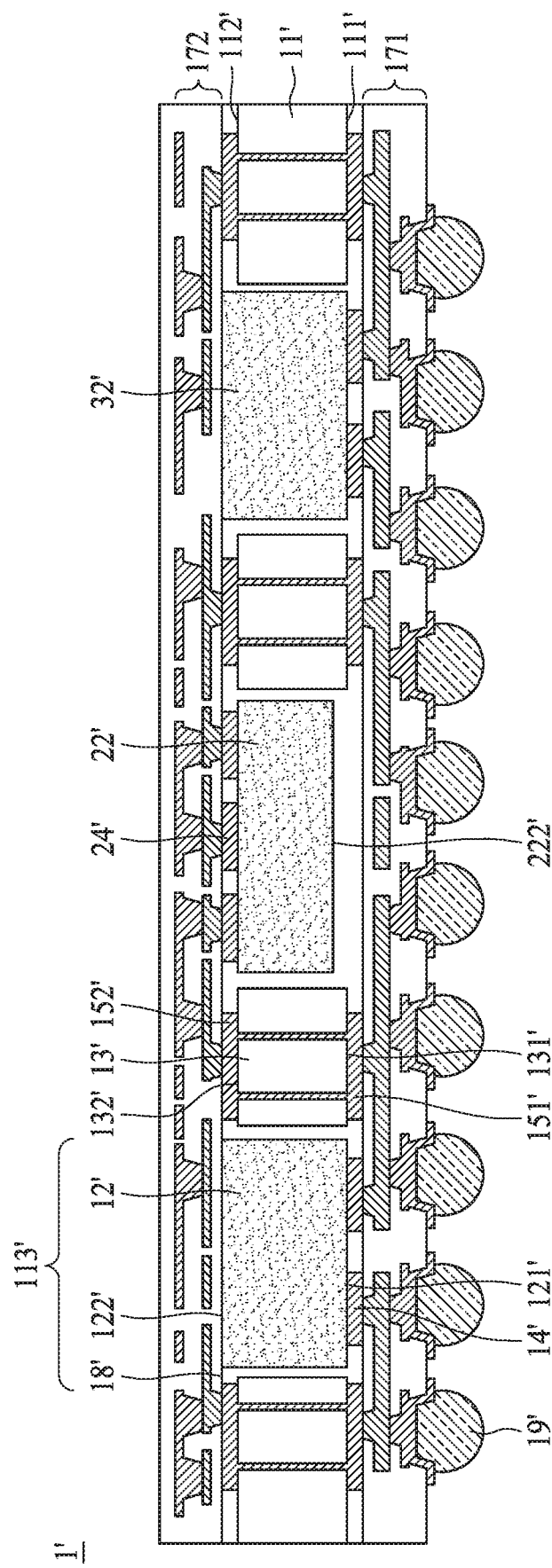
FIG. 1B illustrates a cross-sectional view of a semiconductor device package in accordance with some embodiments of the present disclosure.

FIG. 1B illustrates a cross-sectional view of a semiconductor device package 1' in accordance with some embodiments of the present disclosure. In some embodiments, a semiconductor device package 1' includes a substrate 11', a semiconductor die 12', a conductive via 13', a contact pad 14' and a contact pad 151'. The substrate 11' includes a surface 111', and a surface 112' opposite to the surface 111', the substrate 11' defines a cavity 113' through the substrate 11'. The semiconductor die 12' is disposed in the cavity 113', wherein the semiconductor die 12' includes an active surface 121' adjacent to the first surface 111', and an inactive surface 122'. The conductive via 13' penetrates through the substrate 11'. The contact pad 14' is exposed from the active surface 121' of the semiconductor die 12' and is adjacent to the surface 111' of the substrate 11'. The contact pad 151' is disposed on, adjacent to, or embedded in and exposed by the surface 111' of the substrate 11', wherein the contact pad 151' is connected to an end 131' of the conductive via 13'.

In some embodiments, the contact pad 14' and the contact pad 151' are substantially leveled. In some embodiments, a surface of the contact pad 14' and a surface of the contact pad 151' are substantially coplanar. In some embodiments, a redistribution layer (RDL) 171 is disposed on, adjacent to, or embedded in and exposed by the surface 111' of the substrate 11' and is electrically connected to the first contact pad 14' and the second contact pad 151'. In some embodiments, an electrical conductor 19' is disposed on, adjacent to, or embedded in and exposed by the RDL 171 and is electrically connected to the contact pad 14' and the contact pad 151' through the first RDL 171. In some embodiments, the electrical conductor 19' is a solder ball. In some embodiments, an encapsulation layer 18' is disposed in the cavity 113' and encapsulating edges of the semiconductor die 12'. In some embodiments, a contact pad 152' disposed on, adjacent to, or embedded in and exposed by the surface 112' of the substrate 11', wherein the contact pad 152' is connected to an end 132' of the conductive via 13'. In some embodiments, the encapsulation layer 18' encapsulates the inactive surface 222' of the semiconductor die 22'. In some embodiments, the encapsulation layer 18' further encapsulates the third contact pad 152'. In some embodiments, a RDL 172 is disposed on, adjacent to, or embedded in and exposed by the surface 112' of the substrate 11', and electrically connected to the contact pad 152'. In some embodiments, the inactive surface 122' of the semiconductor die 12' and the surface 112' of the substrate 11' are substantially leveled.

Figure 2A:
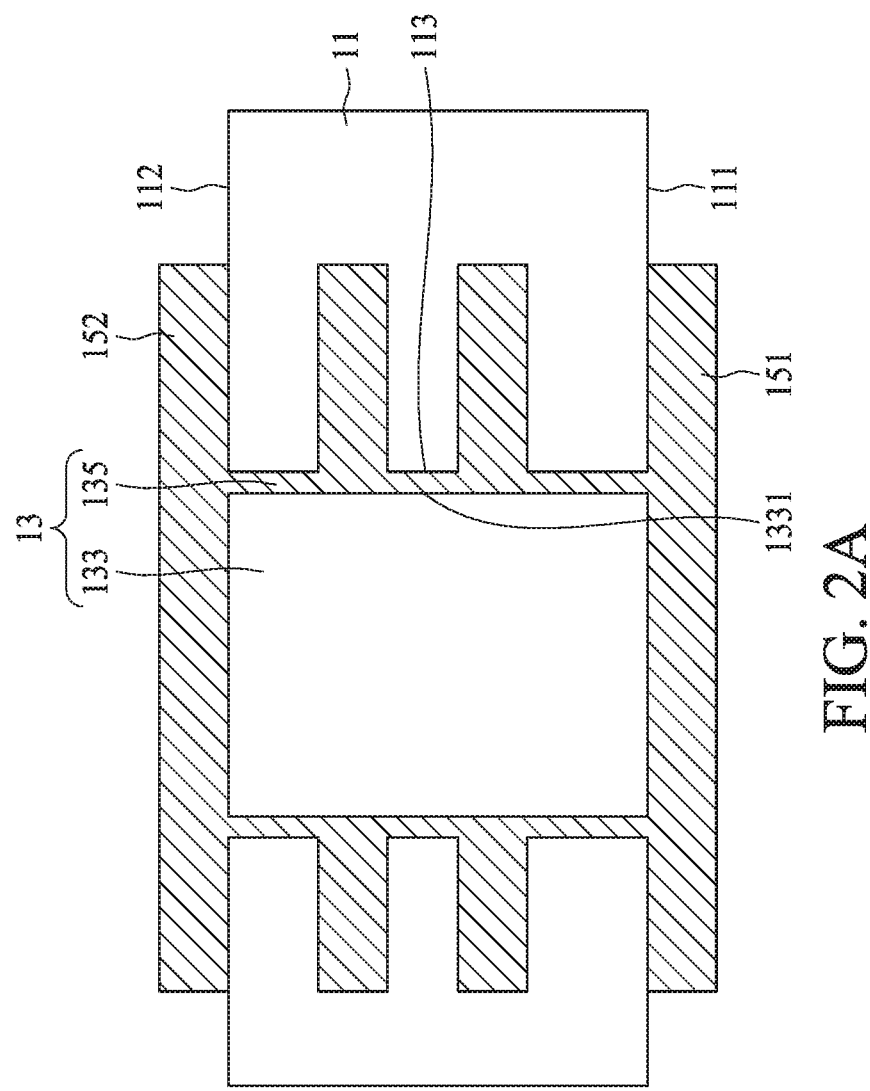
FIG. 2A illustrates a cross-sectional view of a portion of the semiconductor device package in FIG. 1A in accordance with some embodiments of the present disclosure.

FIG. 2A illustrates a cross-sectional view of a portion of the semiconductor device package 1 in FIG. 1A in accordance with some embodiments of the present disclosure. In some embodiments, the conductive via 13 includes an insulating structure 133 through the substrate 11, and a conductive structure 135 between an edge 113 of the substrate 11 and a sidewall 1331 of the insulating structure 133 and electrically connected to the contact pad 151. In some embodiments, the conductive structure 135 surrounds the sidewall 1331 of the insulating structure 133. In some embodiments, the conductive structure 135 includes a liner conductive structure substantially conformal to the edge 113 of the substrate 11.

As shown in FIGS. 1A and 2A, in some embodiments, a semiconductor device package 1 includes a substrate 11, a semiconductor die 12 and a conductive via 13. The substrate 11 includes a surface 111, and a surface 112 opposite to the surface 111. The substrate 11 defines a cavity 113 through the substrate 11. The semiconductor die 12 is disposed in the cavity 113. The conductive via 13 penetrates through the substrate 11, wherein the conductive via 13 includes an insulating structure 133 and a conductive structure 135. The insulating structure 133 penetrates through the substrate 11. The conductive structure 135 is between an edge of the substrate 11 and a sidewall 1331 of the insulating structure 133.

In some embodiments, the conductive structure 135 surrounds the sidewall 1331 of the insulating structure 133. In some embodiments, the conductive structure 135 includes a liner conductive structure substantially conformal to the edge 113 of the substrate 11. In some embodiments, a bottom conductive pad 151 is disposed on, adjacent to, or embedded in and exposed by the surface 111 of the substrate 11 and is electrically connected to the conductive via 13, and a top conductive pad 152 is disposed on, adjacent to, or embedded in and exposed by the surface 112 of the substrate 11 and is electrically connected to the conductive via 13. In some embodiments, the semiconductor die 12 includes an electrical terminal 14 adjacent to the surface 111. In some embodiments, the electrical terminal 14 and the bottom conductive pad 151 are substantially leveled.

In some embodiments, the conductive via 13 includes a bottom conductive pad 151 and a top conductive pad 152, and the insulating structure 133 is enclosed by the conductive structure 135, the bottom conductive pad 151 and the top conductive pad 152. Such structure is a via-in-pad design. Since the via-in-pad design includes filling an insulating structure in the via, the dimple and void issues for electroplating a high aspect ratio though hole to form the conductive via can be overcome. In some embodiments, the encapsulation layer 18 includes dielectric layers on each side of the substrate 11 to protect the substrate 11, the semiconductor die 12 and the conductive via 13. In some embodiments, a laser via 141 is used to electrically connect the semiconductor die 12 with a substrate pattern layer 142. In some embodiments, a laser via 153 is used to electrically connect the bottom conductive pad 151 of the conductive via 13 with the substrate pattern layer 142. In some embodiments, the contact pad 14 is directly connected to the substrate pattern layer 142 by electroplating to form the laser via 141, which is a strong and reliable electrical connection.

Figure 2B:
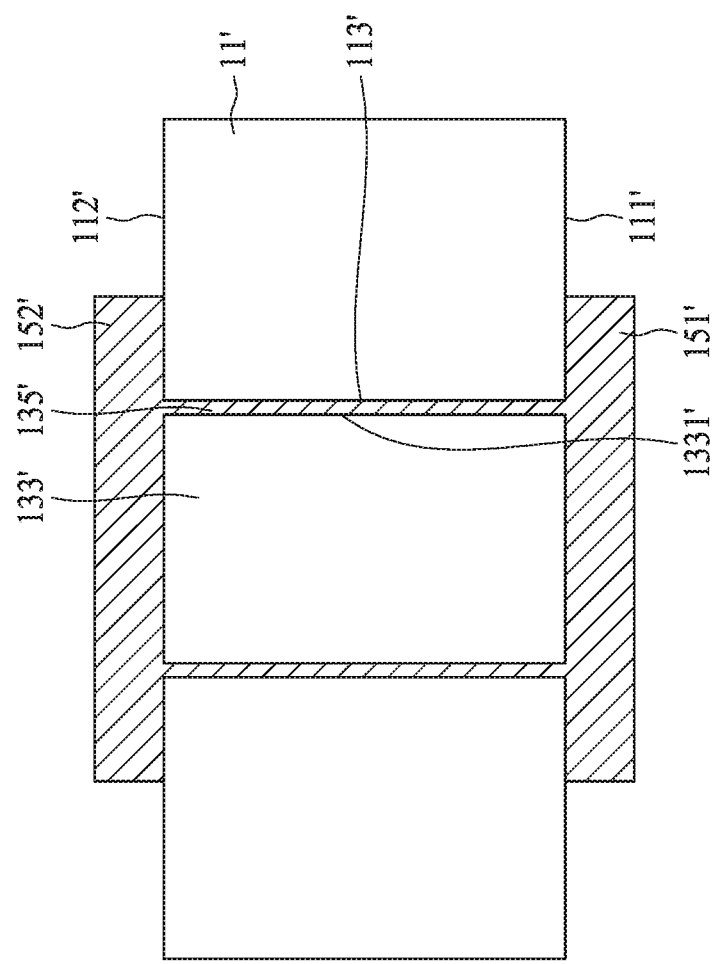
FIG. 2B illustrates a cross-sectional view of a portion of the semiconductor device package in FIG. 1B in accordance with some embodiments of the present disclosure.

FIG. 2B illustrates a cross-sectional view of a portion of the semiconductor device package 1' in FIG. 1B in accordance with some embodiments of the present disclosure. In some embodiments, the conductive via 13' includes an insulating structure 133' through the substrate 11', and a conductive structure 135' between an edge 113' of the substrate 11' and a sidewall 1331' of the insulating structure 133' and electrically connected to the contact pad 151'. In some embodiments, the conductive structure 135' surrounds the sidewall 1331' of the insulating structure 133'.

As shown in FIGS. 1B and 2B, in some embodiments, a semiconductor device package 1' includes a substrate 11', a semiconductor die 12' and a conductive via 13'. The substrate 11' includes a surface 111', and a surface 112' opposite to the surface 111'. The substrate 11' defines a cavity 113' through the substrate 11'. The semiconductor die 12' is disposed in the cavity 113'. The conductive via 13' penetrates through the substrate 11', wherein the conductive via 13' includes an insulating structure 133' and a conductive structure 135'. The insulating structure 133' penetrates through the substrate 11'. The conductive structure 135' is between an edge of the substrate 11' and a sidewall 1331' of the insulating structure 133'.

In some embodiments, the conductive structure 135' surrounds the sidewall 1331' of the insulating structure 133'. In some embodiments, a bottom conductive pad 151' is disposed on, adjacent to, or embedded in and exposed by the surface 111' of the substrate 11' and is electrically connected to the conductive via 13', and a top conductive pad 152' is disposed on, adjacent to, or embedded in and exposed by the surface 112' of the substrate 11' and is electrically connected to the conductive via 13'. In some embodiments, the insulating structure 133' is enclosed by the conductive structure 135', the bottom conductive pad 151' and the top conductive pad 152'. In some embodiments, the semiconductor die 12' includes an electrical terminal 14' adjacent to the surface 111. In some embodiments, the electrical terminal 14' and the bottom conductive pad 151' are substantially leveled. In some embodiments, a RDL 171 is disposed on, adjacent to, or embedded in and exposed by the surface 111' of the substrate 11' and is electrically connected to conductive via 13' through the bottom conductive pad 151'. In some embodiments, a RDL 172 is disposed on, adjacent to, or embedded in and exposed by the surface 112' of the substrate 11', and is electrically connected to the conductive via 13' through the top conductive pad 152'.

In some embodiments, the conductive via 13' includes a bottom conductive pad 151' and a top conductive pad 152', and the insulating structure 133' is enclosed by the conductive structure 135', the bottom conductive pad 151' and the top conductive pad 152'. Such structure is a via-in-pad design. Since the via-in-pad design includes filling an insulating structure in the via, the dimple and void issues for electroplating a high aspect ratio though hole to form the conductive via can be overcome. In some embodiments, the RDLs 171 and 172 both include dielectric layers on each side of the substrate 11' to protect the substrate 11', the semiconductor die 12' and the conductive via 13'. In some embodiments, the RDL 171 is used to electrically connect the semiconductor die 12 with the solder ball 19'. In some embodiments, the RDL 171 is used to electrically connect the bottom conductive pad 151 of the conductive via 13 with the solder ball 19'.

Figure 3:
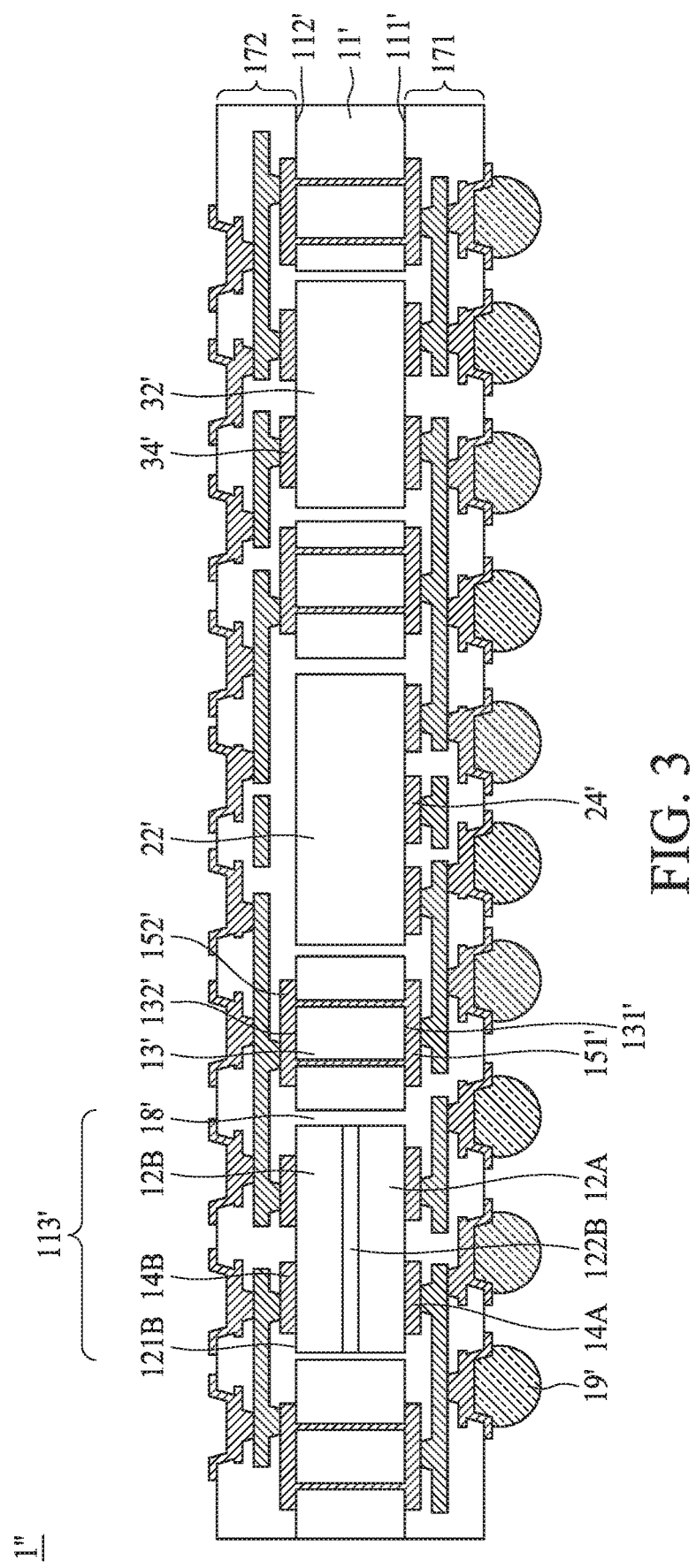
FIG. 3 illustrates a cross-sectional view of a semiconductor device package in accordance with some embodiments of the present disclosure.

FIG. 3 illustrates a cross-sectional view of a semiconductor device package 1" in accordance with some embodiments of the present disclosure. The semiconductor device package 1" in FIG. 3 are similar to the semiconductor device package 1' in FIG. 1B. The difference between the semiconductor device package 1" and the semiconductor device package 1' lies in that a semiconductor die 12B is disposed in the cavity 113' and is stacked on the semiconductor die 12A. In some embodiments, the second semiconductor die 12B includes an active surface 121B adjacent to the second surface 112', and an inactive surface 122B facing the first semiconductor die 12A. In some embodiments, a contact pad 14B is exposed from the active surface 121B of the semiconductor die 12B and is adjacent to the surface 112' of the substrate 11'. In some embodiments, a RDL 172 is disposed on, adjacent to, or embedded in and exposed by the surface 112' of the substrate 11', and is electrically connected to the contact pad 14B.

FIG. 4A, FIG. 4B, FIG. 4C, FIG. 4D, FIG. 4E, FIG. 4F, FIG. 4G and FIG. 4H illustrate a method of manufacturing semiconductor device packages in accordance with some embodiments of the present disclosure.

Figure 4A:
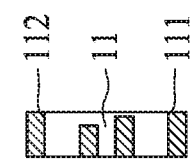
FIG. 4A, FIG. 4B, FIG. 4C, FIG. 4D, FIG. 4E, FIG. 4F, FIG. 4G and FIG. 4H illustrate a method of manufacturing semiconductor device packages in accordance with some embodiments of the present disclosure.
Figure 4A:
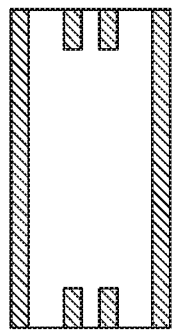
Figure 4A:
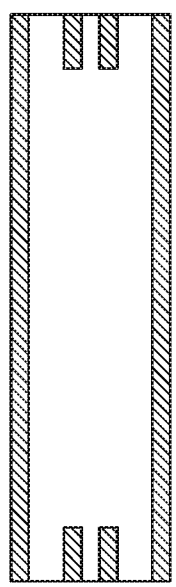
Figure 4A:
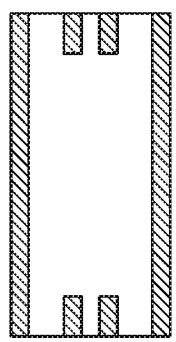
Figure 4A:

FIG. 4A illustrates providing a substrate 11 and forming a through hole through the substrate 11. The substrate 11 includes a surface 111, and a surface 112 opposite to the surface 111. In some embodiments, the through hole is formed by laser drilling.

Figure 4B:
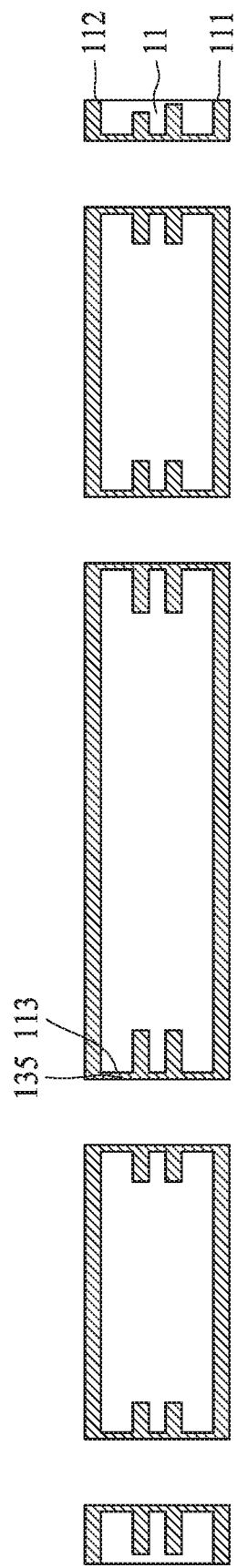

FIG. 4B illustrates forming a conductive structure 135 surrounds the sidewall of the through hole. In some embodiments, the conductive structure 135 is formed by electroplating. In some embodiments, a liner conductive structure 135 is formed on edges of the through hole. In some embodiments, the conductive structure 135 includes a liner conductive structure substantially conformal to the edge 113 of the substrate 11.

Figure 4C:
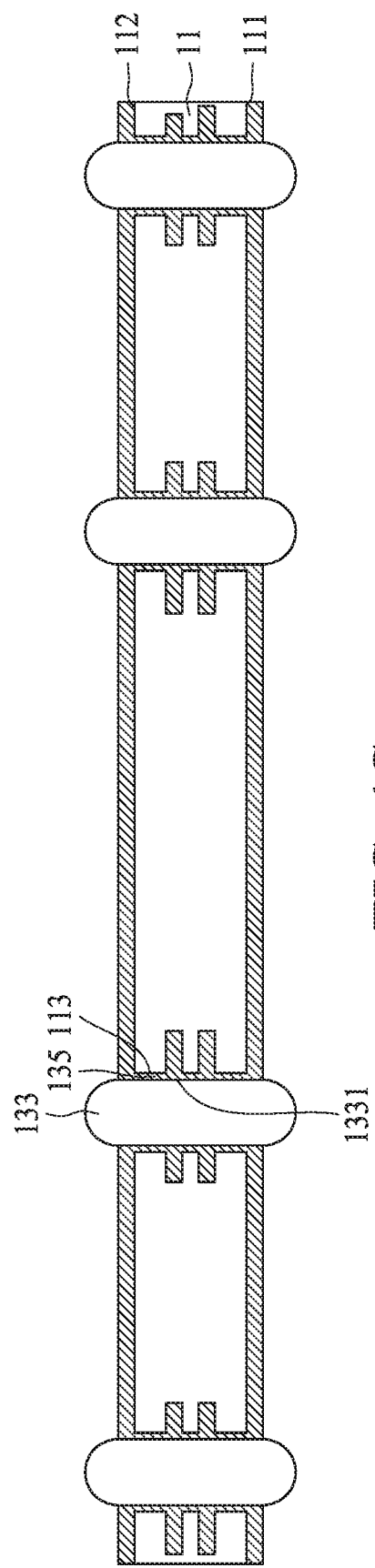

FIG. 4C illustrates filling an insulative structure 133 in the through hole. In some embodiments, the insulative structure can include polyimides (PI) or resin. In some embodiments, a conductive structure 135 is between an edge 113 of the substrate 11 and a sidewall 1331 of the insulating structure 133. In some embodiments, the conductive structure 135 surrounds the sidewall 1331 of the insulating structure 133.

Figure 4D:
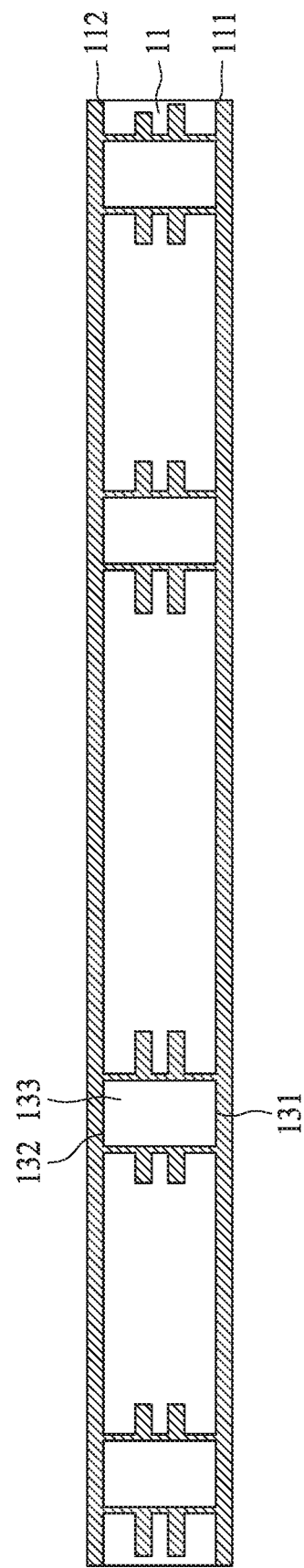

FIG. 4D illustrates grinding the insulative structure to be leveled with the substrate and electroplating a conductive layer on the surface 111 and the surface 112 of the substrate 11.

Figure 4E:
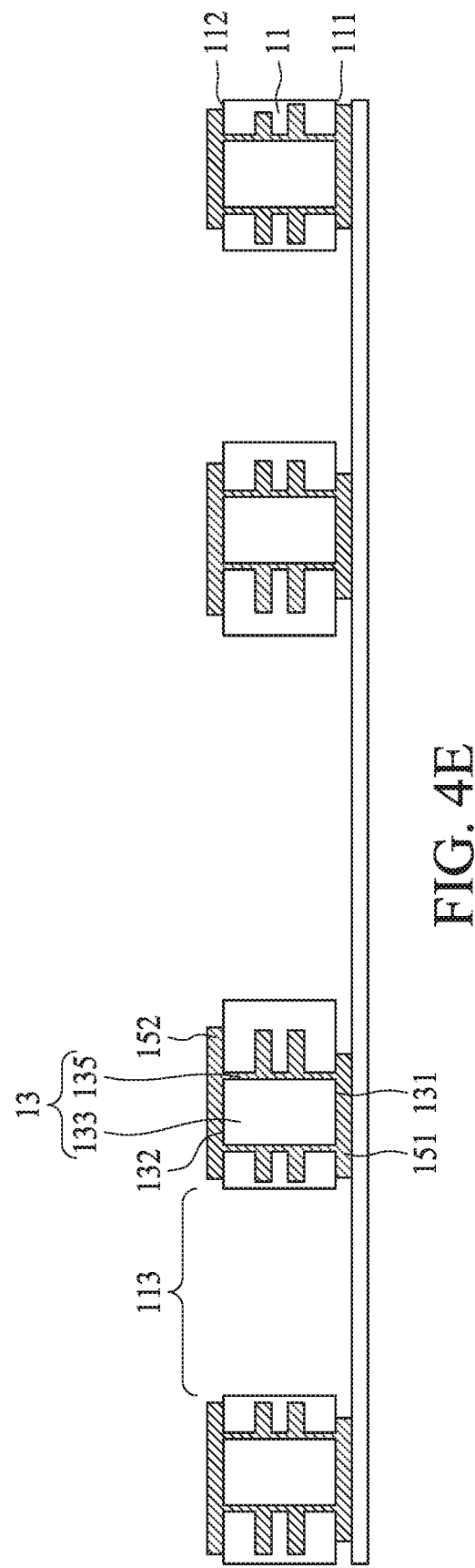

FIG. 4E illustrates patterning the conductive layer on the surface 111 and the surface 112 of the substrate 11 and forming cavities 113 through the substrate. In some embodiments, after patterning the conductive layer, a contact pad 151 is formed on the surface 111 of the substrate 11 and electrically connects to the conductive structure 135. In some embodiments, after patterning the conductive layer, a contact pad 152 is formed on the surface 112 of the substrate 11 and electrically connects to the conductive structure 135. The conductive structure 135 and the insulative structure 133 together form a conductive via 13.

Figure 4F:
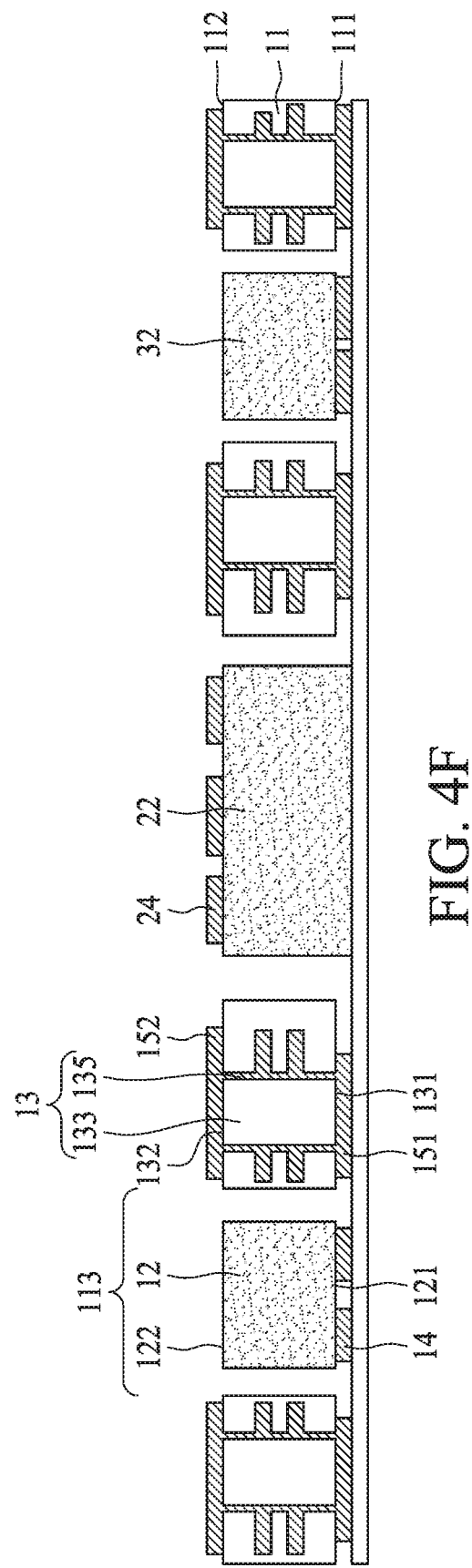

FIG. 4F illustrates disposing semiconductor dies 12, 22 and 32 into the cavities, respectively.

Figure 4G:
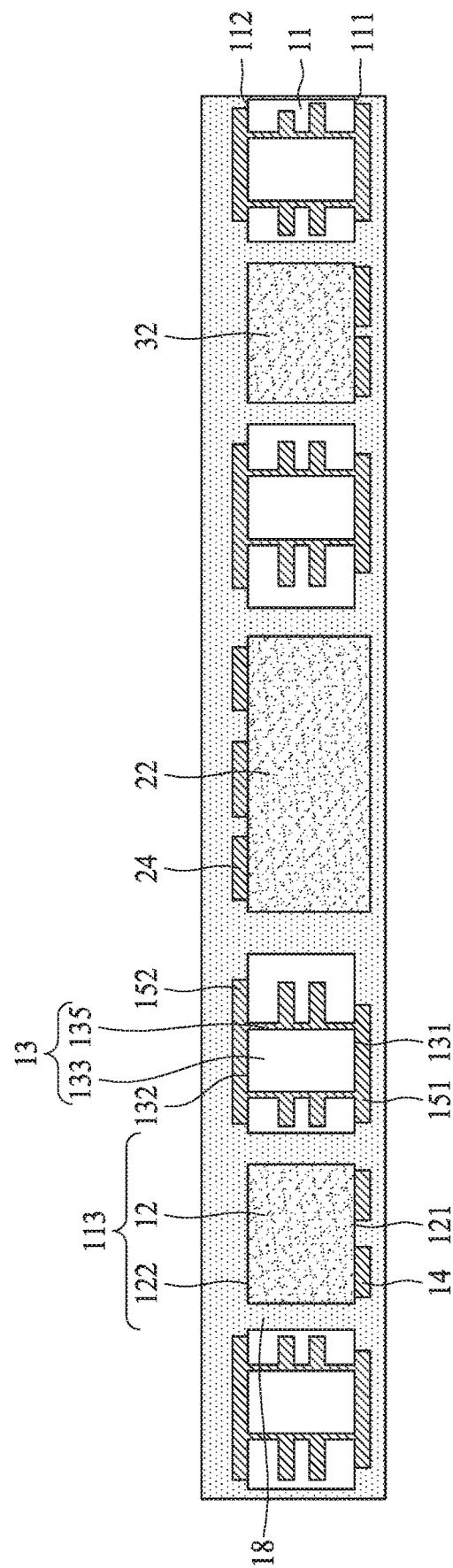

FIG. 4G illustrates laminating or printing dielectric material or encapsulant material into the cavity to form the encapsulation layer 18 for encapsulating edges of the semiconductor dies 12, 22 and 32. In some embodiments, the encapsulation layer 18 encapsulates the active surface 121 of the first semiconductor die 12. In some embodiments, the encapsulation layer 18 encapsulates edges of the contact pad 14 and edges of the contact pad 151. In some embodiments, the encapsulation layer 18 encapsulates the inactive surface 122 of the semiconductor die 12.

Figure 4H:
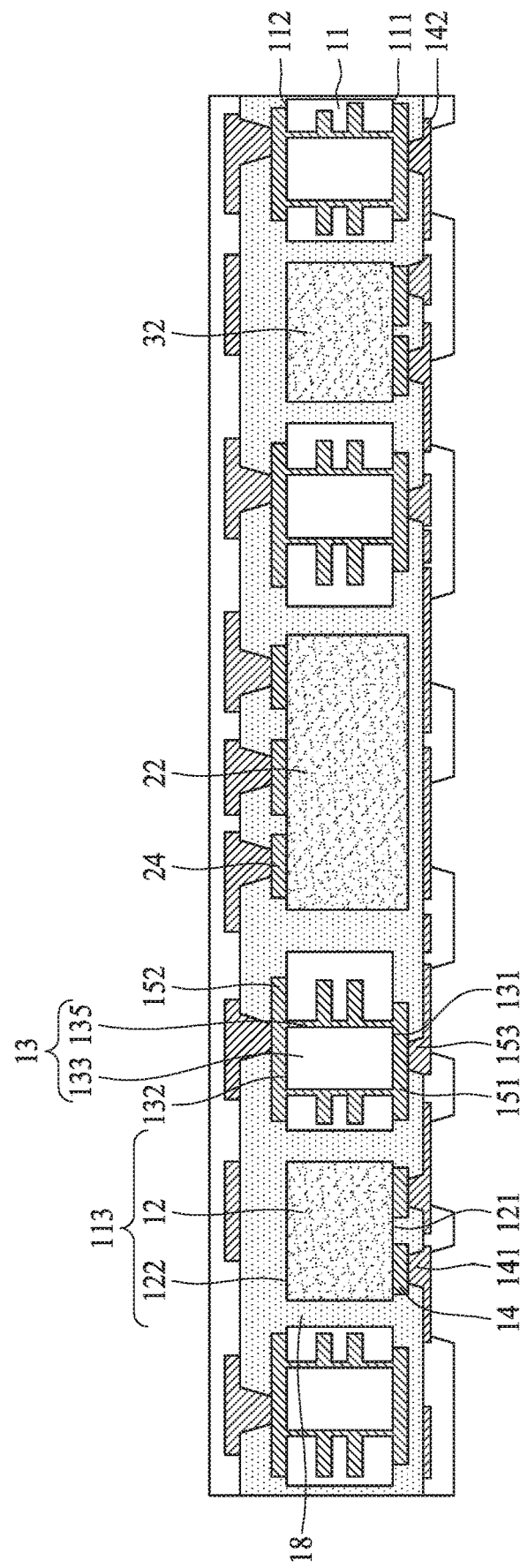

FIG. 4H illustrates using semi-additive process (SAP) to build up patterned conductive layers on each sides of the substrate 11. By further mounting solder balls 19 and singulating the substrate 11, the semiconductor device package 1 in FIG. 1A is formed.

FIG. 5A, FIG. 5B, FIG. 5C, FIG. 5D, FIG. 5E, FIG. 5F, FIG. 5G and FIG. 5H illustrate a method of manufacturing semiconductor device packages in accordance with some embodiments of the present disclosure.

Figure 5A:
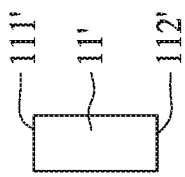
FIG. 5A, FIG. 5B, FIG. 5C, FIG. 5D, FIG. 5E, FIG. 5F, FIG. 5G and FIG. 5H illustrate a method of manufacturing semiconductor device packages in accordance with some embodiments of the present disclosure.
Figure 5A:
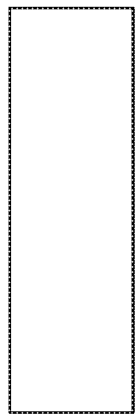
Figure 5A:
Figure 5A:
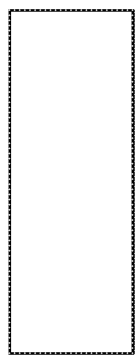
Figure 5A:
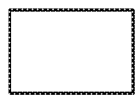

FIG. 5A illustrate illustrates providing a substrate 11' and forming a through hole through the substrate 11'. The substrate 11' includes a surface 111', and a surface 112' opposite to the surface 111'. In some embodiments, the through hole is formed by laser drilling.

Figure 5B:
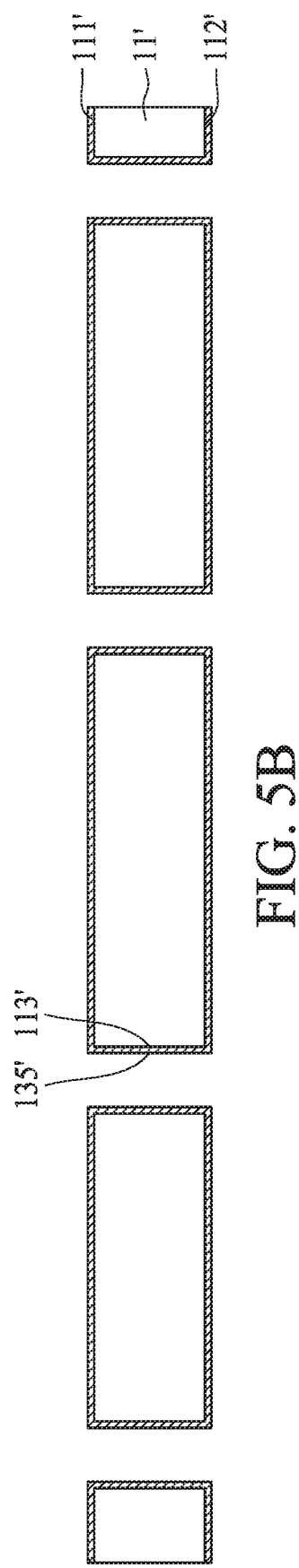

FIG. 5B illustrates forming a conductive structure 135' surrounds the sidewall of the through hole. In some embodiments, the conductive structure 135' is formed by electroplating. In some embodiments, a liner conductive structure 135' is formed on edges of the through hole. In some embodiments, the conductive structure 135' includes a liner conductive structure substantially conformal to the edge 113' of the substrate 11'.

Figure 5C:
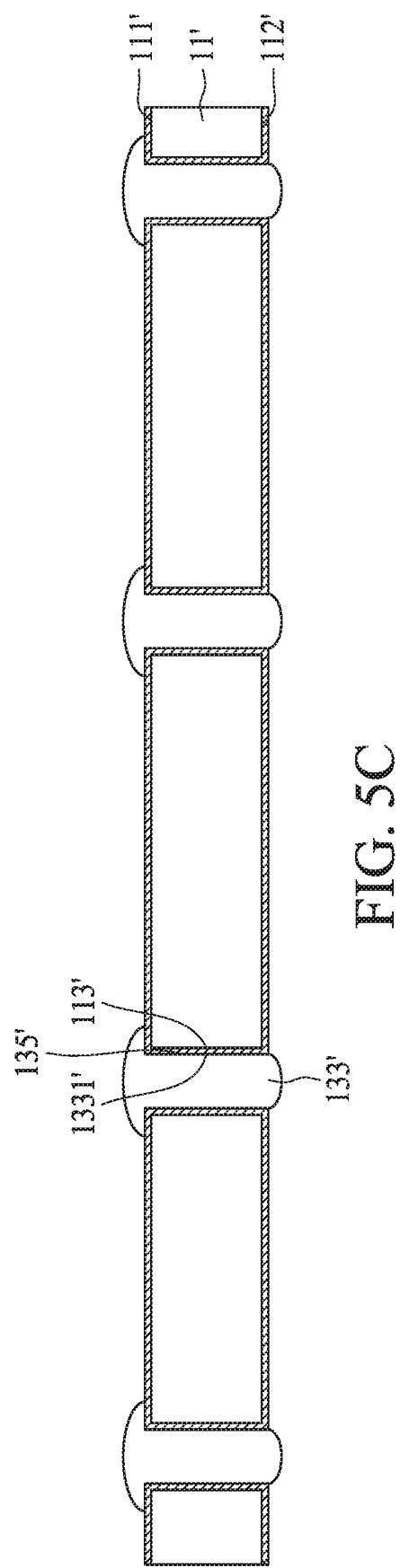

FIG. 5C illustrates filling an insulative structure 133' in the through hole. In some embodiments, the insulative structure can include polyimides (PI) or resin. In some embodiments, a conductive structure 135' is between an edge 113' of the substrate 11' and a sidewall 1331' of the insulating structure 133'. In some embodiments, the conductive structure 135' surrounds the sidewall 1331' of the insulating structure 133'.

Figure 5D:
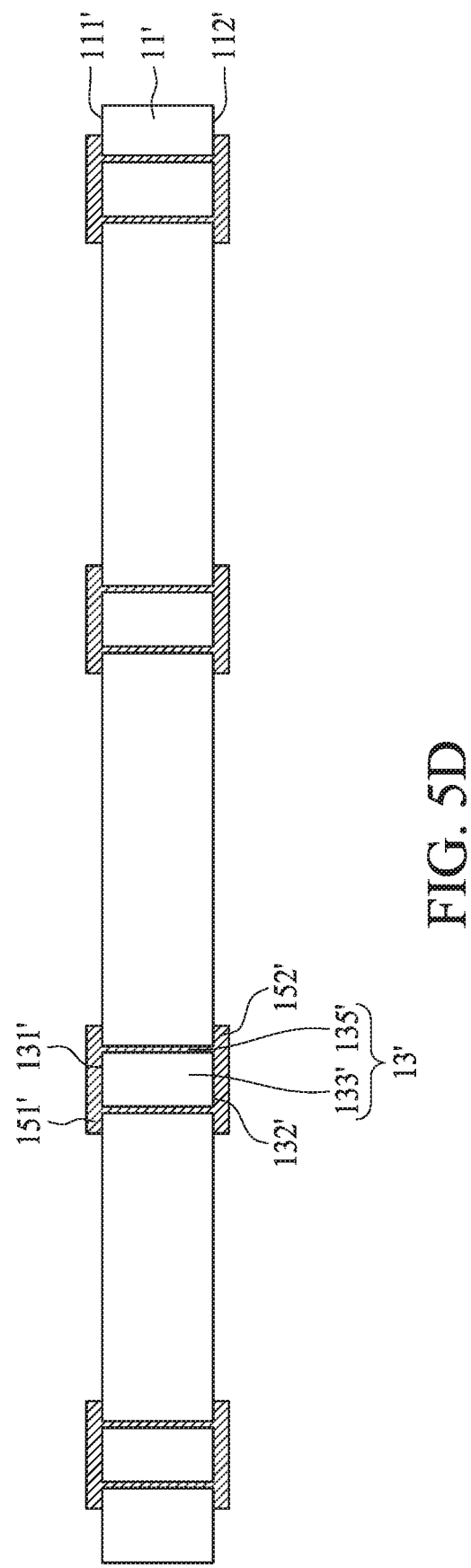

FIG. 5D illustrates grinding the insulative structure to be leveled with the substrate, electroplating a conductive layer on the surface 111' and the surface 112' of the substrate 11' and patterning the conductive layer on the surface 111' and the surface 112' of the substrate 11'. In some embodiments, after patterning the conductive layer, a contact pad 151' is formed on the surface 111' of the substrate 11' and electrically connects to the conductive structure 135'. In some embodiments, after patterning the conductive layer, a contact pad 152' is formed on the surface 112' of the substrate 11' and electrically connects to the conductive structure 135'. The conductive structure 135' and the insulative structure 133' together form a conductive via 13'.

Figure 5E:
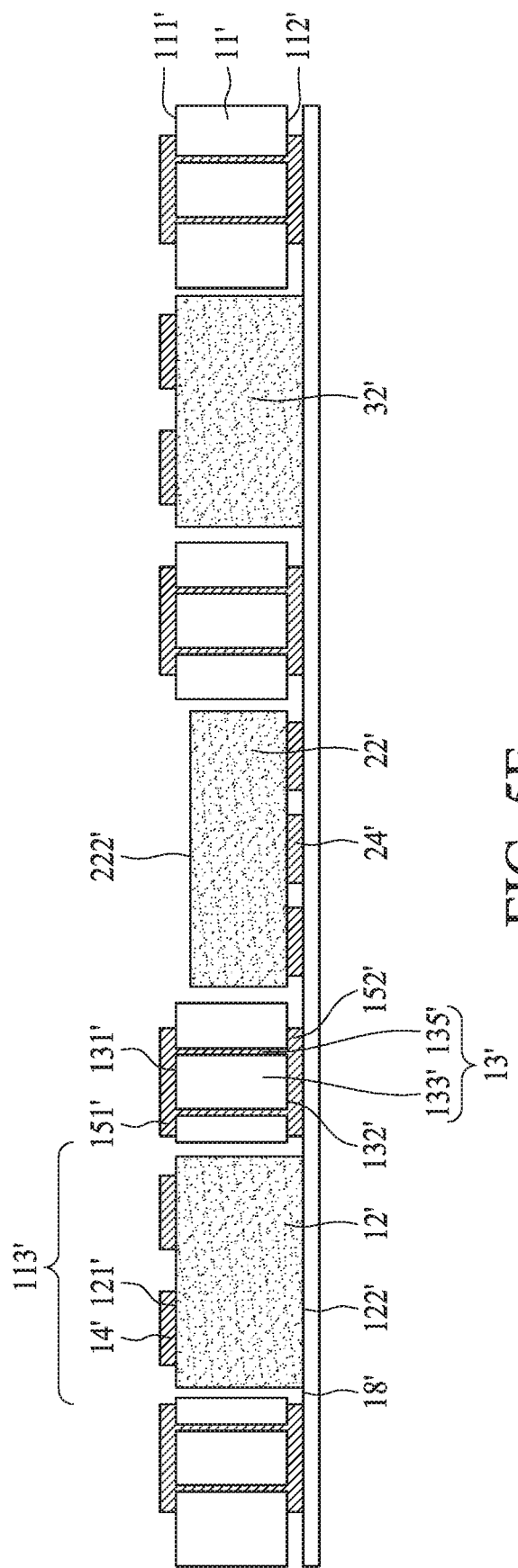

FIG. 5E illustrates and forming cavities 113' through the substrate and disposing semiconductor dies 12', 22' and 32' into the cavities, respectively.

Figure 5F:
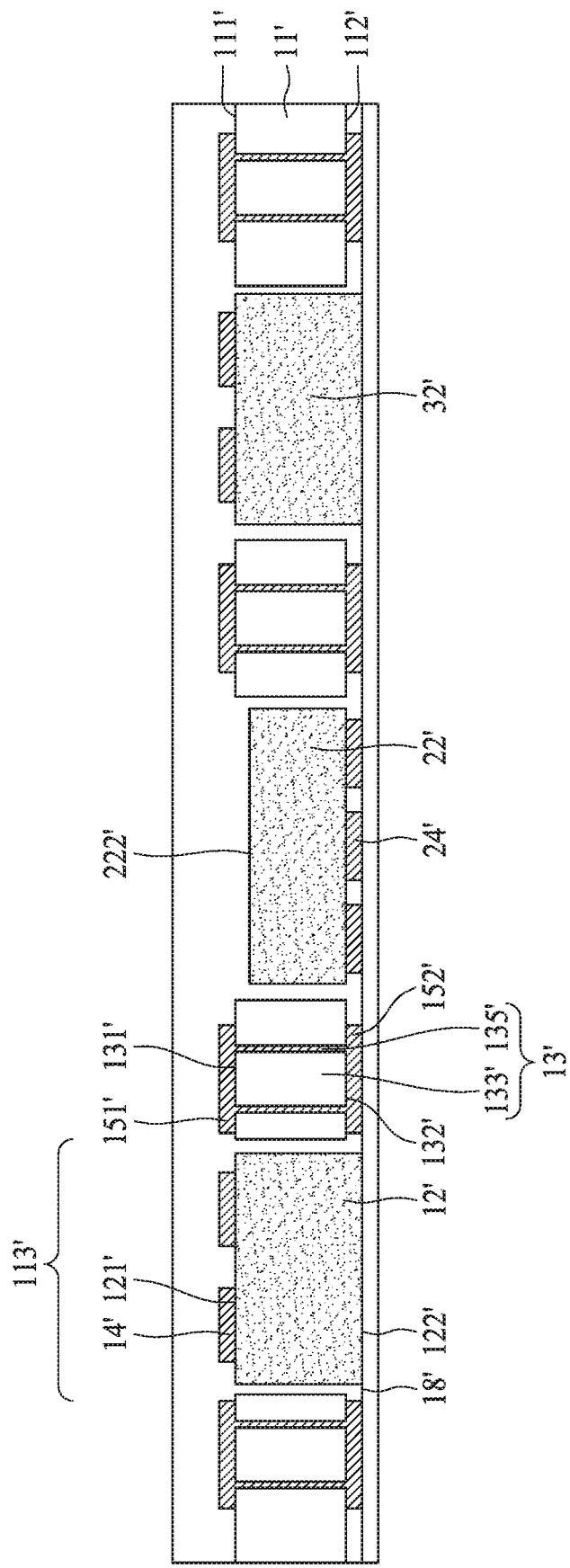

FIG. 5F illustrates molding the semiconductor dies 12', 22' and 32' in the cavity to form the encapsulation layer 18 for encapsulating edges of the semiconductor dies 12', 22' and 32'. In some embodiments, the encapsulation layer 18' encapsulates the active surface 121' of the first semiconductor die 12'. In some embodiments, the encapsulation layer 18' encapsulates edges of the contact pad 14' and edges of the contact pad 151'. In some embodiments, the encapsulation layer 18' encapsulates the inactive surface 222' of the semiconductor die 22'.

Figure 5G:
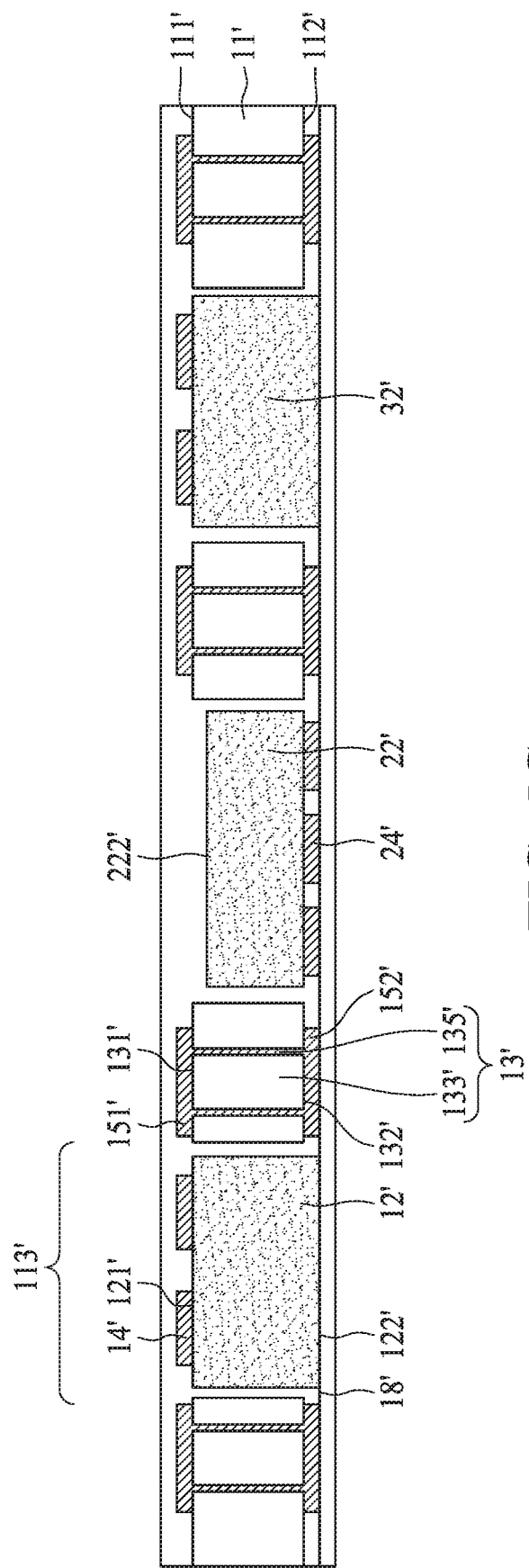

FIG. 5G illustrates grinding the encapsulation layer 18' until the contact pad 14' exposes.

Figure 5H:
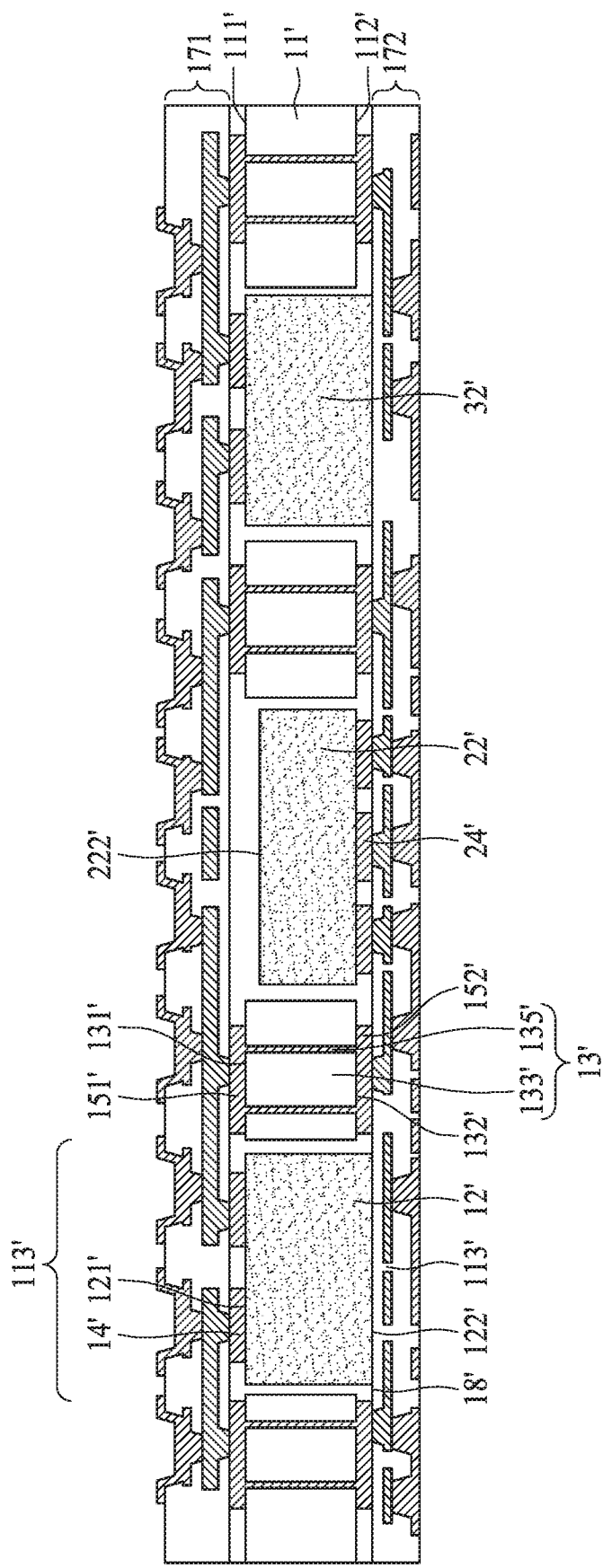

FIG. 5H illustrates building double side RDLs to electrically connect the contact pads of the semiconductor dies 12', 22' and 32' and form circuits on each side of the semiconductor device package 1'. By further mounting solder balls 19' and singulating the substrate 11', the semiconductor device package 1' in FIG. 1B is formed.

The semiconductor device package 1" of FIG. 3 can be formed by methods similar to the method of manufacturing semiconductor device packages shown in FIG. 5A, FIG. 5B, FIG. 5C, FIG. 5D, FIG. 5E, FIG. 5G and FIG. 5H.

Figure 6:
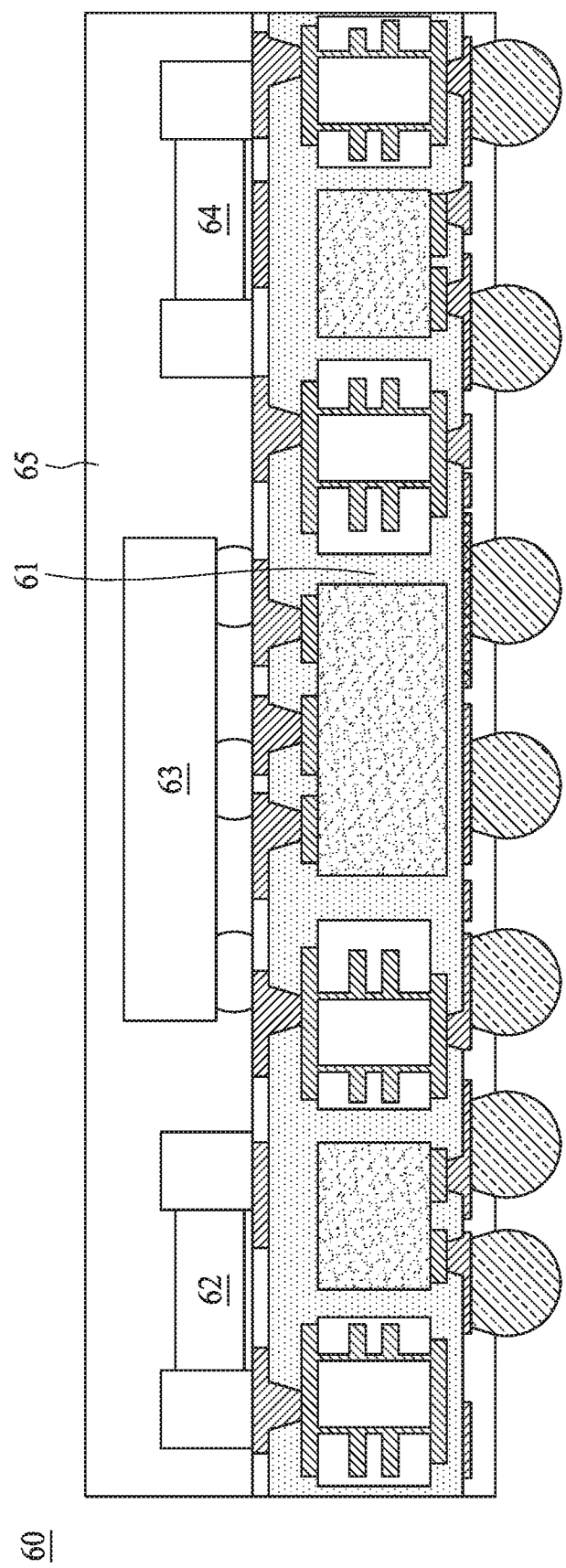
FIG. 6 illustrates a cross-sectional view of a semiconductor device package in accordance with some embodiments of the present disclosure.

FIG. 6 illustrates a cross-sectional view of a semiconductor device package 60 in accordance with some embodiments of the present disclosure. The semiconductor device package 60 includes a semiconductor device package 61 similar to the semiconductor device package 1 shown in FIG. 1A. Passive electrical components 62 and 64 are mounted on the top surface of the semiconductor device package 61. A semiconductor die 63 also mounted on the top surface of the semiconductor device package 61. The passive electrical components 62 and 64 and the semiconductor die 63 are encapsulated by molding compound.

Figure 7:
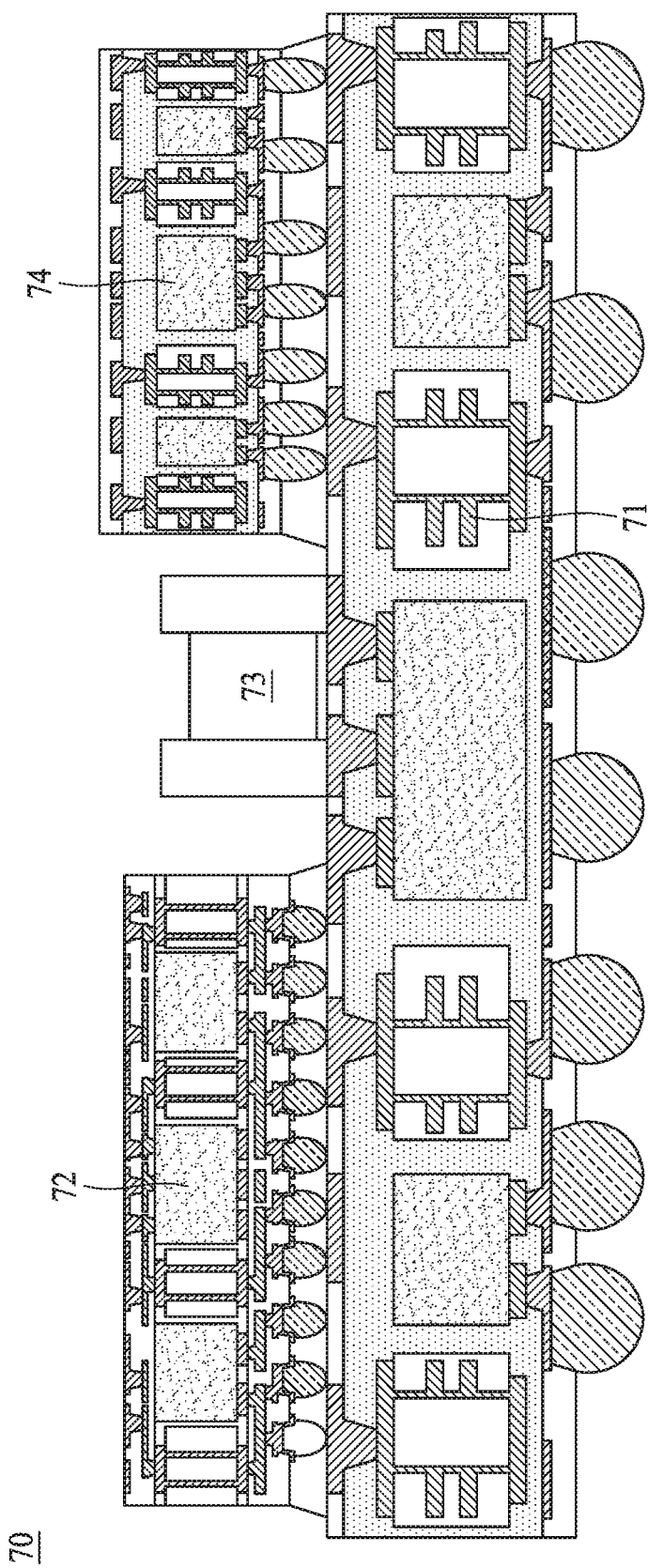
FIG. 7 illustrates a cross-sectional view of a semiconductor device package in accordance with some embodiments of the present disclosure.

FIG. 7 illustrates a cross-sectional view of a semiconductor device package 70 in accordance with some embodiments of the present disclosure. The semiconductor device package 70 includes a semiconductor device package 71 similar to the semiconductor device package 1 shown in FIG. 1A, a semiconductor device package 72 similar to the semiconductor device package 1' shown in FIG. 1B and a semiconductor device package 74 similar to the semiconductor device package 1 shown in FIG. 1A but of a different scale from the semiconductor device package 71. A passive electrical component 73 is mounted on the top surface of the semiconductor device package 71. The semiconductor device packages 72 and 74 are also mounted on the top surface of the semiconductor device package 71.

Figure 8:
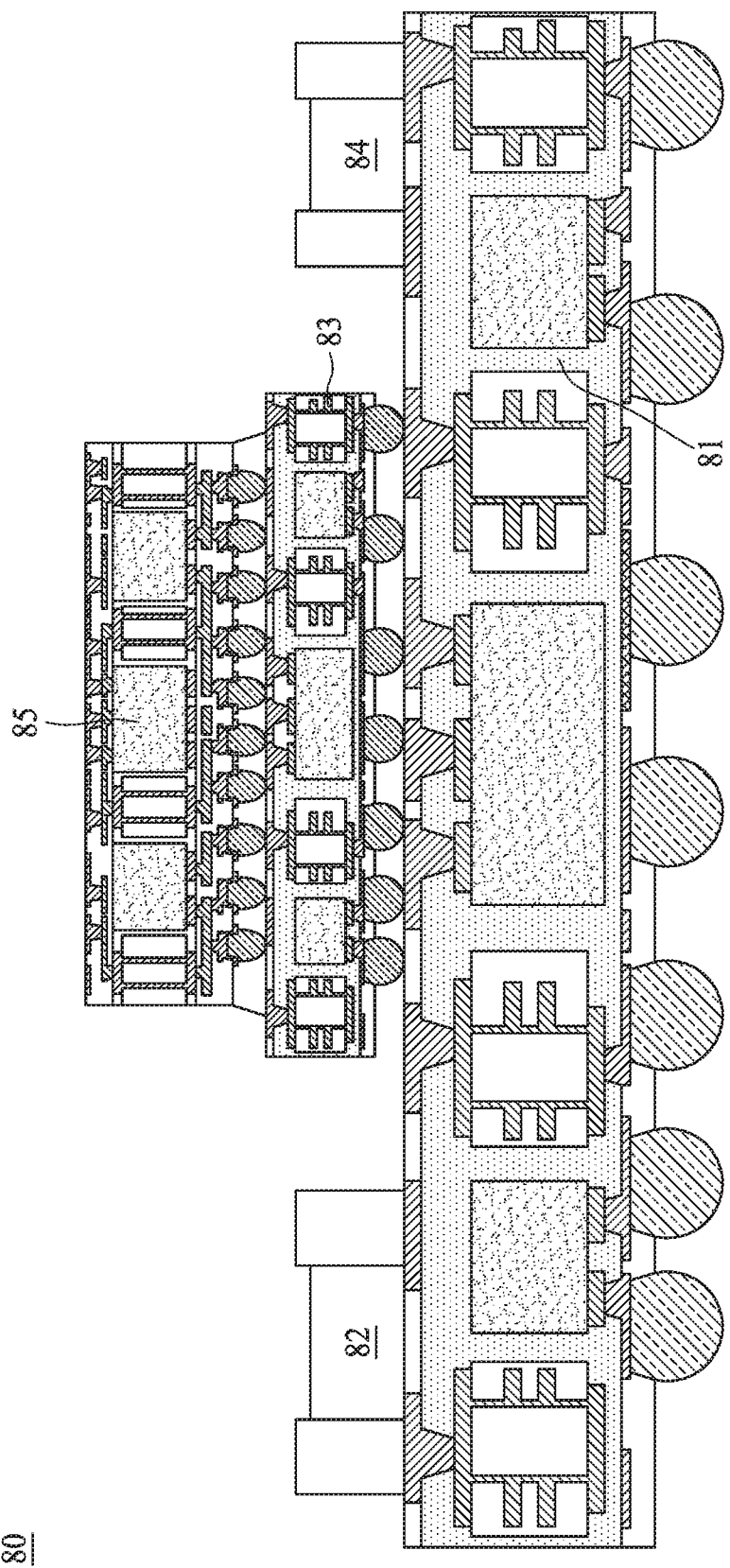
FIG. 8 illustrates a cross-sectional view of a semiconductor device package in accordance with some embodiments of the present disclosure.

FIG. 8 illustrates a cross-sectional view of a semiconductor device package 80 in accordance with some embodiments of the present disclosure. The semiconductor device package 80 includes a semiconductor device package 81 similar to the semiconductor device package 1 shown in FIG. 1A, a semiconductor device package 83 similar to the semiconductor device package 1 shown in FIG. 1A but of a different scale from the semiconductor device package 81, and a semiconductor device package 85 similar to the semiconductor device package 1' shown in FIG. 1B. Passive electrical component 82 and 84 are mounted on the top surface of the semiconductor device package 84. The semiconductor device package 83 is also mounted on the top surface of the semiconductor device package 81, and the semiconductor device package 85 is mounted on the top surface of the semiconductor device package 83.

As used herein, the singular terms "a," "an," and "the" may include plural referents unless the context clearly dictates otherwise.

As used herein, the terms "connect," "connected," and "connection" refer to an operational coupling or linking.

Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of the manufacturing methods described herein. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The construction and arrangement of the structures and methods as shown in the various example embodiments are illustrative only. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the example embodiments without departing from the scope of the present disclosure.

What is claimed is:

1. A semiconductor device package, comprising:
    a substrate including a first surface, the substrate defining a cavity through the substrate;
    a first semiconductor die disposed in the cavity, wherein the first semiconductor die includes an active surface at a same side of the first surface;
    a conductive via through the substrate;
    a first contact pad exposed from the active surface and protruded from a horizontal level of the first surface of the substrate;
    a second contact pad disposed on a first end of the conductive via and protruded from the first surface;
    a first via disposed on the first contact pad;
    a second via disposed on the second contact pad;
    an encapsulation layer encapsulating the first contact pad and the second contact pad;
    a third contact pad disposed on a second end of the conductive via opposite to the first end, and protruded from a second surface of the substrate opposite to the first surface; and
    a second semiconductor die disposed in the cavity and stacked on the first semiconductor die, wherein the second semiconductor die includes an active surface at a same side of the second surface of the substrate.

2. The semiconductor device package of claim 1, further comprising a first redistribution layer (RDL) disposed on the first surface of the substrate and electrically connected to the first contact pad through the first via and the second contact pad through the second via.

3. The semiconductor device package of claim 1, wherein the encapsulation layer further encapsulates an interface between the first contact pad and the first via.

4. The semiconductor device package of claim 1, further comprising a fourth contact pad exposed from the active surface of the second semiconductor die and protruded from a horizontal level of the second surface of the substrate, and a fourth via is disposed on the fourth contact pad.

5. The semiconductor device package of claim 4, further comprising a second RDL disposed on the second surface of the substrate, and electrically connected to the fourth contact pad through the fourth via, wherein a solder ball is electrically connected to the fourth contact pad through the second RDL.

6. The semiconductor device package of claim 1, wherein the first contact pad and the second contact pad are substantially leveled.

7. The semiconductor device package of claim 1, wherein the encapsulation layer further encapsulates the active surface of the first semiconductor die and the active surface of the second semiconductor die.

8. The semiconductor device package of claim 1, wherein the active surface of the second semiconductor die and a second surface of the substrate opposite to the first surface are substantially leveled.

9. The semiconductor device package of claim 1, wherein the first via comprises a first end and a second end, wherein the first end is closer to the first surface than the second end, and wherein a width of the first end is smaller than a width of the second end.

10. The semiconductor device package of claim 1, wherein the encapsulation layer further encapsulates an interface between the second via and the second contact pad.

11. The semiconductor device package of claim 1, further comprising a third via disposed on the third contact pad.

12. The semiconductor device package of claim 11, further comprising a second RDL disposed on the second surface of the substrate, and electrically connected to the third contact pad through the third via.

* * * * *